(12) United States Patent
Lin et al.

(10) Patent No.: US 10,269,437 B2
(45) Date of Patent: Apr. 23, 2019

(54) NON-VOLATILE MEMORY DEVICE AND OPERATION METHOD OF THE SAME

(71) Applicant: Copee Technology Company, Hsinchu (TW)

(72) Inventors: Chrong-Jung Lin, Hsinchu (TW); Ya-Chin King, Taipei (TW)

(73) Assignee: Copee Technology Company, Hsinchu (TW)

(*) Notice: Subject to any disclaimer, the term of this patent is extended or adjusted under 35 U.S.C. 154(b) by 0 days.

(21) Appl. No.: 15/925,740

(22) Filed: Mar. 19, 2018

(65) Prior Publication Data

US 2018/0315481 A1 Nov. 1, 2018

(30) Foreign Application Priority Data

May 1, 2017 (TW) .............................. 106114414 A

(51) Int. Cl.
| | |
|---|---|
| H01L 27/115 | (2017.01) |
| G11C 16/26 | (2006.01) |
| G11C 16/04 | (2006.01) |
| G11C 16/14 | (2006.01) |
| H01L 23/528 | (2006.01) |
| H01L 27/11524 | (2017.01) |
| H01L 29/423 | (2006.01) |
| G11C 16/10 | (2006.01) |

(52) U.S. Cl.
CPC .......... *G11C 16/26* (2013.01); *G11C 16/0433* (2013.01); *G11C 16/0441* (2013.01); *G11C 16/10* (2013.01); *G11C 16/14* (2013.01); *H01L 23/528* (2013.01); *H01L 27/11524* (2013.01); *H01L 29/42328* (2013.01); *G11C 16/0425* (2013.01)

(58) Field of Classification Search
CPC ................ G11C 16/0433; G11C 16/14; H01L 27/11524; H01L 29/42328
USPC ....................................................... 365/185.29
See application file for complete search history.

(56) References Cited

U.S. PATENT DOCUMENTS

| | | | | |
|---|---|---|---|---|
| 5,717,636 | A | * | 2/1998 | Dallabora .......... G11C 16/0416 257/E27.103 |
| 7,208,796 | B2 | * | 4/2007 | Chang ............... H01L 21/28273 257/239 |
| 9,406,689 | B2 | * | 8/2016 | Li .......................... H01L 21/845 |
| 2007/0155087 | A1 | * | 7/2007 | Chang ............... H01L 21/28273 438/201 |
| 2015/0035039 | A1 | * | 2/2015 | Li .......................... H01L 21/845 257/316 |

* cited by examiner

*Primary Examiner* — Xiaochun L Chen
(74) *Attorney, Agent, or Firm* — CKC & Partners Co., LLC

(57) ABSTRACT

A non-volatile memory device including a first floating-gate element, a second floating-gate element, and a selection gate element. The first floating-gate element includes a gate electrode configured to generate a read current based on the read voltage, the control voltage, and the electrical state of the gate electrode. The second floating-gate element shares a gate electrode with the first floating-gate element and is configured to determine the electrical state of the gate electrode based on the write voltage and the control voltage. The selection gate element is electrically coupled to the first floating-gate element and the second floating-gate element and is configured to generate the control voltage according to the word driving voltage and the source driving voltage.

2 Claims, 5 Drawing Sheets

US 10,269,437 B2

1

NON-VOLATILE MEMORY DEVICE AND OPERATION METHOD OF THE SAME

RELATED APPLICATIONS

This application claims priority to Taiwan Application Serial Number 106114414, filed May 1, 2017, which is herein incorporated by reference.

BACKGROUND

Field of Invention

The present invention relates to a memory device, and more particular to a non-volatile memory device and operation method of the same.

Description of Related Art

In recent years, due to the single chip process of the integrated chip system, memory must be integrated with the system into a single chip. Therefore, the thickness of the gate oxide will shrink as the process of integration shrinks. Typically, non-volatile memory devices use a single transistor to perform reading and writing process. However, since both reading and writing processes need to apply voltage to this transistor, it is easy to damage the thinner gate oxide of this transistor, which will reduce the reliability of the element.

Therefore, how to design a new non-volatile memory device and an operating method thereof to solve the above-mentioned deficiencies is an urgent problem to be solved by this industry.

SUMMARY

An object of the present invention is to provide a non-volatile memory device including a first floating-gate element, a second floating-gate element, and a selection gate element. The first floating-gate element includes a gate electrode configured to generate a read current based on the read voltage, the control voltage, and the electrical state of the gate electrode. The second floating-gate element shares a gate electrode with the first floating-gate element and is configured to determine the electrical state of the gate electrode based on the write voltage and the control voltage. The selection gate element is electrically coupled to the first floating-gate element and the second floating-gate element and is configured to generate the control voltage according to the word driving voltage and the source driving voltage.

Another object of the present invention is to provide a non-volatile memory device including a first floating-gate element, a second floating-gate element, a first selection gate element, a third floating-gate element, a fourth floating-gate element, and a second selection gate element. The first floating-gate element includes a first gate and is configured to generate a first read current according to a first read voltage, a first control voltage, and a first electrical state of the first gate. The second floating-gate element shares the first gate with the first floating-gate element and is configured to determine the first electrical state of the first gate according to the first write voltage and the first control voltage. The first selection gate element is electrically coupled to the first floating-gate element and the second floating-gate element and is configured to generate a control voltage according to the word driving voltage and the source driving voltage. The third floating-gate element includes a

2 second gate and is configured to generate a second read current according to a second read voltage, a second control voltage, and a second electrical state of the second gate. The fourth floating-gate element shares a second gate with the third floating-gate element and is configured to determine the second electrical state of the second gate according to the second write voltage and the second control voltage. The second selection gate element is electrically coupled to the third floating-gate element and the fourth floating-gate element and is configured to generate a control voltage according to the word driving voltage and the source driving voltage.

Another object of the present invention is to provide a method for operating a non-volatile memory device. The method comprises to cause a selection gate element to generate a control voltage according to a word driving voltage and a source driving voltage; to cause the first floating-gate element with the gate to generate a read current according to the read voltage, the control voltage and the gate electrical state; to cause the selection gate element to generate a control voltage according to the word drive voltage and the source drive voltage; to cause the second floating-gate element sharing the gate with the first floating-gate element to determine the electrical state of the gate according to the write voltage and the control voltage.

The advantage of the present invention is that the reading process and writing process of the non-volatile memory device are performed by different elements. Therefore, the damage to the oxide layer can be reduced and the reliability of the devices can be improved accordingly.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE EMBODIMENTS

Figure 1A:
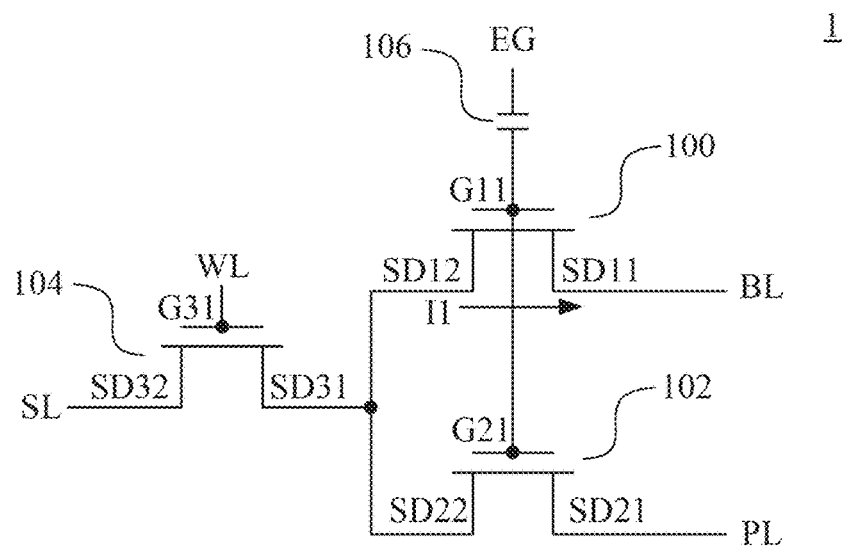
FIG. 1A depicts a schematic diagram of a circuit of the non-volatile memory device according to an embodiment of this invention.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and elements are schematically depicted in order to simplify the drawings. Wherever possible, the same reference numbers are used in the drawings and the description to refer to the same or like parts.

Figure 1B:
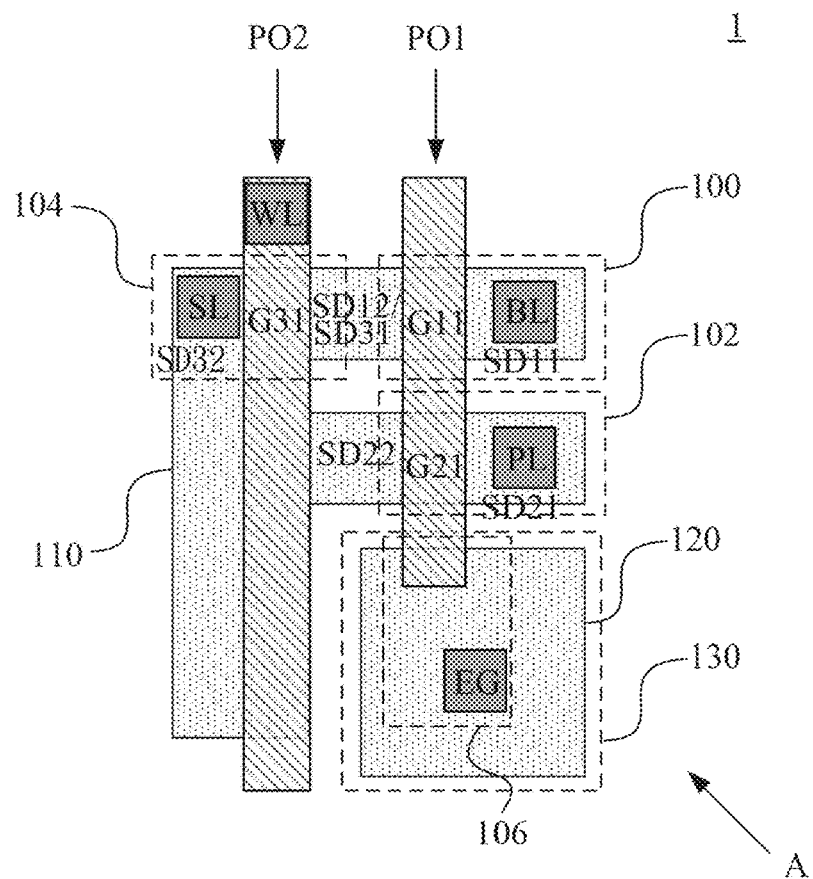
FIG. 1B depicts a schematic diagram of a layout of the non-volatile memory device according to an embodiment of this invention.
Figure 1C:
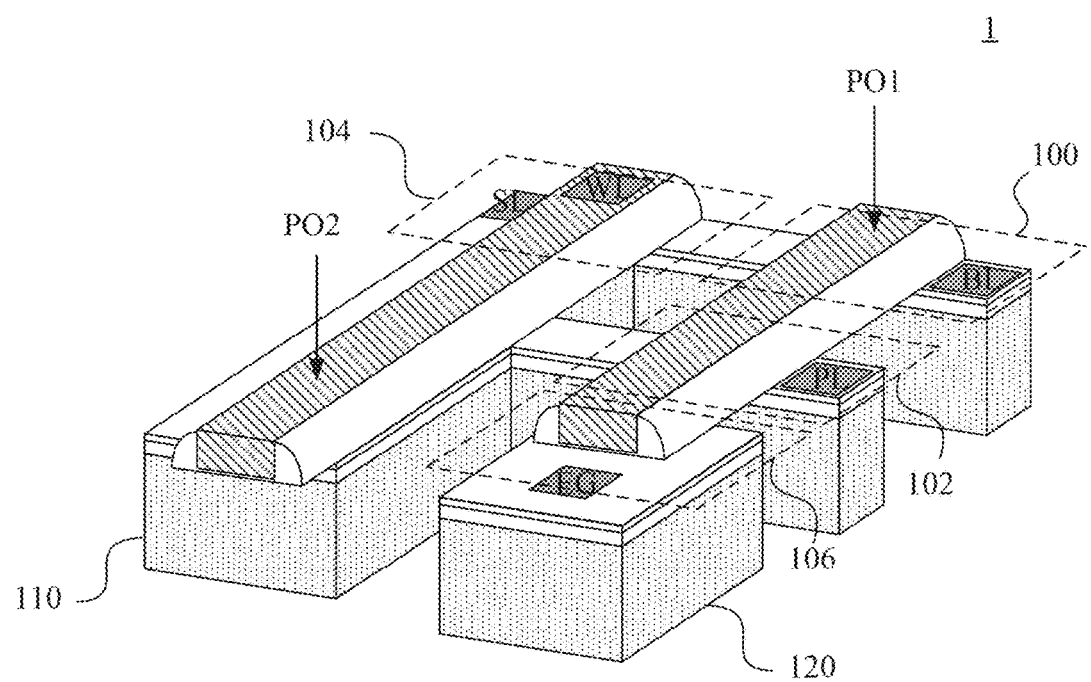
FIG. 1C depicts a perspective view of the non-volatile memory device in FIG. 1B taken along a direction A according to an embodiment of this invention.

Please refer to FIG. 1A, FIG. 1B and FIG. 1C. FIG. 1A depicts a schematic diagram of a circuit of the non-volatile memory device 1 according to an embodiment of this invention. FIG. 1B depicts a schematic diagram of a layout of the non-volatile memory device 1 according to an embodiment of this invention. FIG. 1C depicts a perspective view of the non-volatile memory device 1 in FIG. 1B taken along a direction A according to an embodiment of this invention.

The non-volatile memory device 1 includes a floating-gate element 100, a floating-gate element 102, and a selection gate element 104.

The floating-gate element 100 includes a gate G11, a source/drain SD11, and a source/drain SD12 corresponding to a dashed box labeled 100 in FIG. 1B and FIG. 1C. The floating-gate element 102 includes a gate G21, a source/drain SD21, and a source/drain SD22 corresponding to the dashed box labeled 102 in FIG. 1B and FIG. 1C.

As shown in FIG. 1B, the non-volatile memory device 1 includes an active region 110 depicted in a dot pattern. The source/drain SD11, SD12 of the floating-gate element 100, and the source/drain SD21, SD22 of the floating-gate element 102 are formed in the active region 110.

In this embodiment, the gate G11 of the floating-gate element 100 and the gate G21 of the floating-gate element 102 are floating-gates, and in fact, they share a single structure, such as, but not limited to, a polysilicon structure PO1 as shown in FIG. 1B. The polysilicon structure PO1 is formed on the active region 110.

The source/drain SD11, SD12 of the floating-gate element 100 is located on both sides of the polysilicon structure PO1, and the source/drain SD21, SD22 of the floating-gate element 102 are also located on both sides of the polysilicon structure PO1. The source/drain SD11 of the floating-gate element 100 is electrically coupled to the bit line BL. The source/drain SD21 of the floating-gate element 102 is electrically coupled to the write line PL.

The selection gate element 104 includes a selection gate G31, a source/drain SD31, and a source/drain SD32 corresponding to a dotted box labeled 104 in FIG. 1B and FIG. 1C. The selection gate G31 is electrically coupled to the word line WL. The source/drain SD31 is electrically coupled to the source/drain SD12 of the floating-gate element 100 and the source/drain SD22 of the floating-gate element 102. The source/drain SD32 is electrically coupled to the source line SL.

As shown in FIG. 1B, the source/drain SD31 and SD32 of the selection gate element 104 are also formed in the active region 110. The selection gate G31 of the selection gate element 104 is, such as, but not limited to, a polysilicon structure PO2 as shown in FIG. 1B. The polysilicon structure PO2 is formed on the active region 110. The source/drain SD31, SD32 are located on both sides of the polysilicon structure PO2.

It should be noted that the source/drain SD31 and the source/drain SD12 actually correspond to the same region of the active region 100.

It should be noted that, in FIG. 1A, the entities of the signal lines are not shown. Instead, the texts BL, PL, WL and SL are used to represent the signal lines BL, PL, WL and SL which the circuit nodes will be electrically connected to. On the other hand, in FIG. 1B and FIG. 1C, the entities of the signal lines are not shown. Instead, the texts BL, PL, WL and SL designated on the contacts with gray pattern are used to represent the signal lines BL, PL, WL and SL which the contacts will be electrically connected to.

Operationally, when the selection gate G31 of the selection gate element 104 receives the word driving voltage and the source driving voltage from the word line WL, and the source/drain SD32 receives the source driving voltage from the source line SL, a control voltage is generated on the source/drain SD31.

In one embodiment, the word driving voltage turns on the selection gate element 104 so that the source driving voltage is transmitted from the source/drain SD32 to the source/drain SD31 to output the control voltage. Moreover, the word driving voltage may be, such as, but not limited to, 3.3 volts, and the source driving voltage and the control voltage may be, such as, but not limited to, 0 volts.

In floating-gate element 100, when the source/drain SD11 receives a read voltage from bit line BL, and the source/drain SD12 receives a control voltage from the source/drain SD31, a read current I1 is generated according to the electrical state of the gate G11. In an embodiment, the read voltage may be, such as, but not limited to, 1 volt.

On the other hand, in the floating-gate element 102, when the source/drain SD21 receives the write voltage from the write line PL and the source/drain SD22 receives the control voltage from the source/drain SD31, the electrical state of the gate G21 is determined according to the write voltage. In an embodiment, the write voltage may be, such as, but not limited to, 7 volts.

It should be noted that, as described above, since both the gate G11 and the gate G21 belong to the same polysilicon structure PO1, the electrical states of the gate G11 and the gate G21 are the same.

In an embodiment, when the polysilicon structure PO1 is in an initial state where no electrons are stored and the floating-gate element 102 is written according to the high-level writing voltage, electrons will be stored in the polysilicon structure PO1. When the polysilicon structure PO1 is in the initial state where no electrons are stored and the floating-gate element 102 is written according to the low-level write voltage, electrons will not be stored in the polysilicon structure PO1. Therefore, one of the states, stored state and un-stored state of the electrons, is corresponding to a high state data, and the other state is corresponding to a low state data.

On the other hand, when the floating-gate element 100 generates the read current I1 according to the read voltage and the electrical state of the gate G11, an external circuit (not shown) determines an electrical state of the Polysilicon structure PO1 according to the strength of the read current I1, and determines the contents of the stored data.

As shown in FIG. 1B, the non-volatile memory device 1 further includes an active area 120 spaced apart from the active area 110 and formed in the N-type area 130. The polysilicon structure PO1 extends to the active region 120 to form an erase gate element 106. Therefore, the erase gate element 106 is electrically coupled to the gate G11 of the floating-gate element 100 and the gate G21 of the floating-gate element 102.

The erase gate element 106 is electrically coupled to an erase line EG. In FIG. 1B and FIG. 1C, the entity of the erase line is not shown. Instead, the text EG designated on the contacts with gray pattern are used to represent the erase line EG which the contacts will be electrically connected to.

The erase gate element 106 is configured to erase the electrical state in the first floating-gate element 100 and the electrical state in the second floating-gate element 102 according to the erase voltage of the erase line EG to return to the above-mentioned initial state, un-stored state of the electrons. In an embodiment, the erase voltage may be, such as, but not limited to, 10 volts.

Please refer to Table 1. Table 1 is an example of the voltage values applied to the signal lines during the reading process, the writing process and the erasing process according to an embodiment of the present invention. In Table 1, the labels, S and US, are used to represent whether a corresponding non-volatile memory device is selected to be executed or not.

TABLE 1

|  | WL | | BL/BLB | | PL | |
| --- | --- | --- | --- | --- | --- | --- |
|  | S | US | S | US | S | US |
| writing | 3.3 | 0 | 0 | 0 | 7 | 0 |
| erasing |  | 0 |  | 0 |  | 0 |
| reading | 3.3 | 0 | 1 | 0 | 0 | 0 |
|  | SL | | EG | | | |
| writing | 0 | | 0 | | | |
| erasing | 0 | | 10 | | | |
| reading | 0 | | 0 | | | |

In some techniques, the reading process and writing process of memory is performed using a single element, such as, but not limited to, a transistor. Since both reading and writing processes need to apply voltage to the same element, it is easy to damage the oxide layer and reduce the reliability of the element. The reading and writing processed of the non-volatile memory device 1 of the present invention are performed respectively by different elements. Therefore, the damage to the oxide layer can be reduced and the reliability of the device 1 can be improved accordingly.

Furthermore, when the writing operation causes the damage to the oxide layer of the second floating-gate element responsible for writing and generates an oxide trap, the first floating-gate element responsible for reading will not be affected due to separately performing.

Figure 2A:
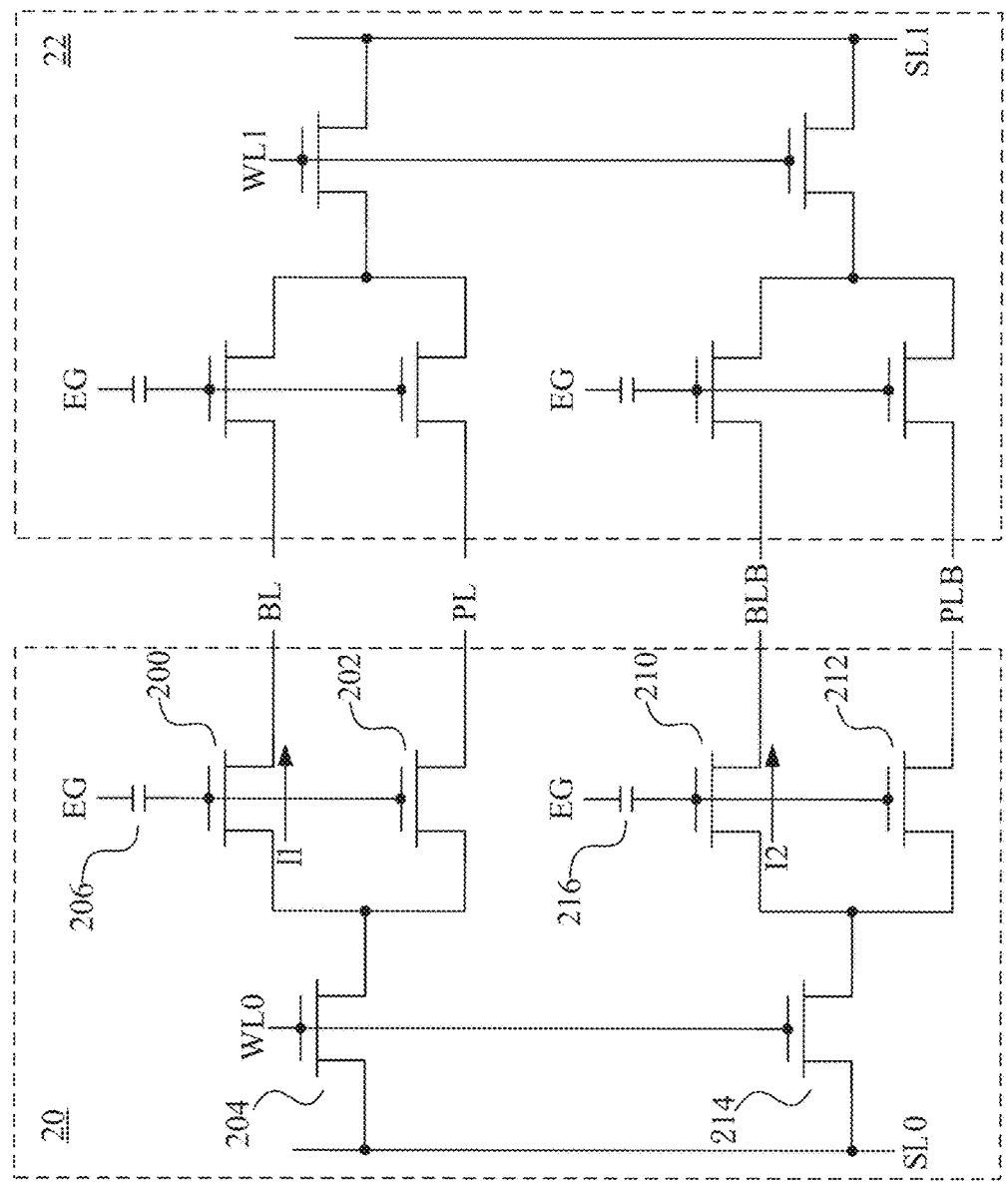
FIG. 2A depicts a schematic diagram of a circuit of the non-volatile memory device according to an embodiment of this invention.
Figure 2B:
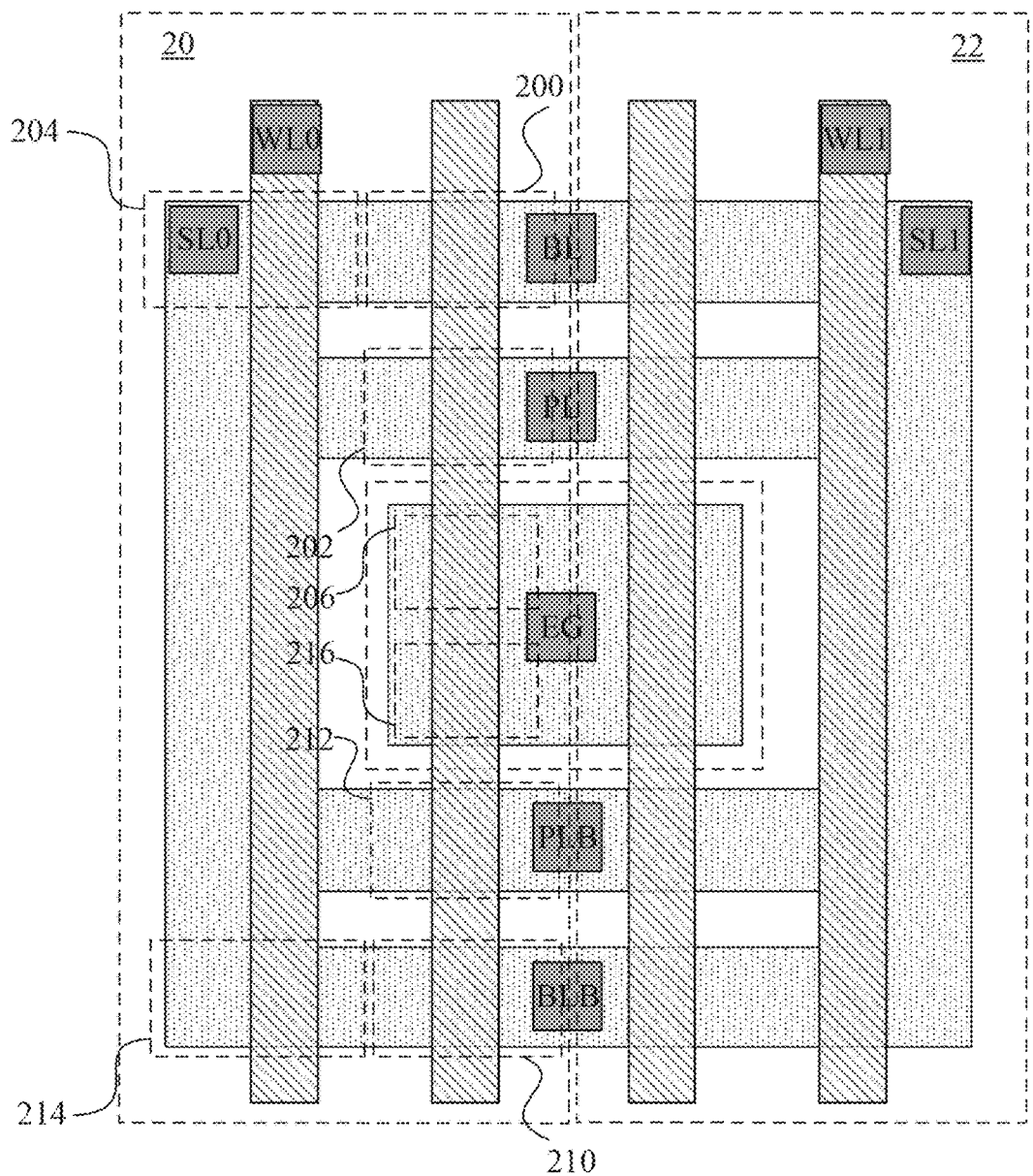
FIG. 2B depicts a schematic diagram of a layout of the non-volatile memory device according to an embodiment of this invention.

Please refer to FIG. 2A and FIG. 2B. FIG. 2A depicts a schematic diagram of a circuit of the non-volatile memory devices 20 and 22 according to an embodiment of this invention. FIG. 2B depicts a schematic diagram of a layout of the non-volatile memory devices 20 and 22 according to an embodiment of this invention.

The non-volatile memory device 20 is a differential structure memory that includes floating-gate elements 200, 202, 210, and 212 and selection gate elements 204 and 214.

The floating-gate element 200, the floating-gate element 202 and the selection gate element 204 correspond to the non-volatile memory device 1 in FIG. 1A.

Similar to the operation of the non-volatile memory device 1, the selection gate element 204 is turned on according to the word driving voltage of the word line WL0 and the source driving voltage of the source line SL0 to generate a control voltage to the floating-gate element 200 and floating-gate element 202.

The floating-gate element 200 generates the read current I1 according to the read voltage of the bit line BL and the control voltage. The floating-gate element 202 and the floating-gate element 200 share a gate, and the electrical state of the gate is determined according to the write voltage of the write line PL and the control voltage.

Floating-gate element 210, floating-gate element 212 and selection gate element 214 also correspond to the non-volatile memory device 1 in FIG. 1A.

Similar to the operation of the non-volatile memory device 1, the selection gate element 214 is turned on according to the word driving voltage of the word line WL0 and the source driving voltage of the source line SL0 to generate the control voltage to the floating-gate element 210 and the floating-gate element 212.

The floating-gate element 210 is turned on to generate the read current I2 according to the read voltage of the bit line BLB and the control voltage. The floating-gate element 212 shares the gate with the floating-gate element 210 and determines the electrical state of gate according to the write voltage of the write line PLB and the control voltage.

It should be noted that, the voltages applied to the write line PL and the write line PLB are opposite during writing data. That is, one of two write lines, the write line PL and the write line PLB, is applied a high-level voltage, the other one will be applied a low-level voltage. Therefore, the electrical state of the gate shared by the floating-gate elements 200 and 202 will be opposite to that of the gate shared by the floating-gate elements 210 and 212.

On the other hand, the reading voltage of the bit line BL and the bit line BLB are the same during reading data. At this time, the read currents I1 and I2 generated by the floating-gate elements 200 and 210 will have different current values corresponding to the opposite electrical states.

Furthermore, the non-volatile memory device 20 further includes erase gate elements 206 and 216. The erase gate element 206 corresponds to the floating-gate elements 200 and 202 and the erase gate element 216 corresponds to the floating-gate elements 210 and 212. The erase gate elements 206 and 216 are both electrically coupled to the erase line EG for erasing the electrical state of the floating-gate elements 200, 202, 210 and 212 according to the erase voltage.

The structure of the non-volatile memory device 22 is the same as that of the non-volatile memory device 20. Moreover, the non-volatile memory device 22 also corresponds to the bit line BL and the bit line BLB as well as the write line PL and the write line PLB, and thus will not be described in detail. However, the difference between the non-volatile memory device 22 and the non-volatile memory device 20 is that the non-volatile memory device 22 corresponds to the word line WL1 and the source line SL1.

Figure 3:
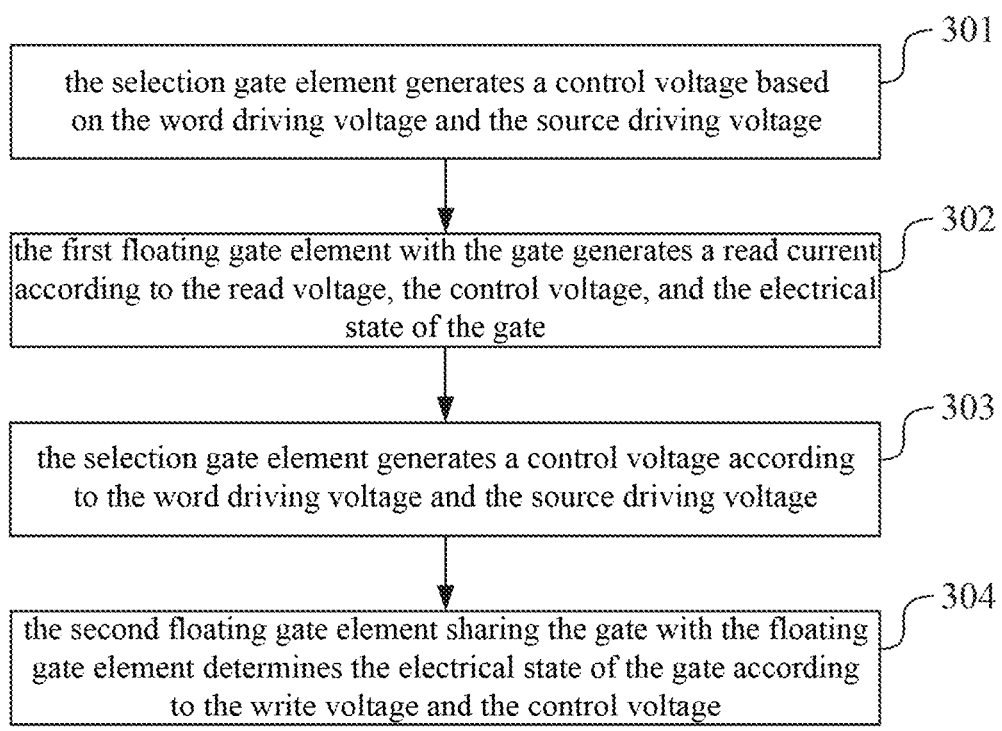
FIG. 3 depicts a flowchart of a method for operating the non-volatile memory device according to an embodiment of the present invention.

FIG. 3 is a flowchart of a method 300 for operating a non-volatile memory device according to an embodiment of the present invention. The method 300 may be applied to the non-volatile memory device 1 of FIG. 1A. The method 300 for operating a non-volatile memory device includes the following steps. However, it should be noticed that these steps mentioned in this embodiment may be adjusted according to actual needs. Moreover, these steps or partial of these steps may be performed simultaneously.

In step 301, the selection gate element 104 generates a control voltage based on the word driving voltage and the source driving voltage.

In step 302, the first floating-gate element with the gate, such as f the floating-gate element 100 in FIG. 1A, generates a read current I1 according to the read voltage, the control voltage, and the electrical state of the gate.

In step 303, the selection gate element 104 generates a control voltage based on the word driving voltage and the source driving voltage.

In step 304, the second floating-gate element, such as the floating-gate element 102 in FIG. 1A, sharing the gate with the floating-gate element 100 determines the electrical state of the gate according to the write voltage and the control voltage.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A non-volatile memory device, comprising:
   a first floating-gate element, wherein the first floating-gate element comprises a first gate and is configured to generate a first read current according to a first read voltage, a first control voltage, and a first electrical state of the first gate;
   a second floating-gate element, wherein the second floating-gate element shares the first gate with the first floating-gate element and is configured to determine the first electrical state of the first gate according to a first write voltage and the first control voltage;
   a first selection gate element, wherein the first selection gate element is electrically coupled to the first floating-gate element and the second floating-gate element and is configured to generate the first control voltage according to a word driving voltage and a source driving voltage;
   a third floating-gate element, wherein the third floating-gate element comprises a second gate and is configured to generate a second read current according to a second read voltage, a second control voltage, and a second electrical state of the second gate;
   a fourth floating-gate element, wherein the fourth floating-gate element shares the second gate with the third floating-gate element and is configured to determine the second electrical state of the second gate according to a second write voltage and the second control voltage; and
   a second selection gate element, wherein the second selection gate element is electrically coupled to the third floating-gate element and the fourth floating-gate element and is configured to generate the second control voltage according to the word driving voltage and the source driving voltage.

2. The non-volatile memory device of claim 1, further comprising:
   a first erase gate element electrically coupled to the first gate sharing by the first floating-gate element and the second floating-gate element, wherein the first erase gate element is configured to erase the first electrical state of the first floating-gate element and the second floating-gate element according to an erase voltage in an erase voltage line; and
   a second erase gate element electrically coupled to the second gate sharing by the third floating-gate element and the fourth floating-gate element, wherein the second erase gate element is configured to erase the second electrical state of the third floating-gate element and the fourth floating-gate element according to the erase voltage in the erase voltage line.

* * * * *